United States Patent
Hong

(10) Patent No.: US 9,570,187 B2
(45) Date of Patent: Feb. 14, 2017

(54) DATA STORAGE DEVICE AND OPERATING METHOD THEREOF

(71) Applicant: SK hynix Inc., Gyeonggi-do (KR)

(72) Inventor: Ji Man Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/876,642

(22) Filed: Oct. 6, 2015

(65) Prior Publication Data
US 2017/0011805 A1    Jan. 12, 2017

(30) Foreign Application Priority Data
Jul. 10, 2015    (KR) .................. 10-2015-0098489

(51) Int. Cl.
*G11C 16/28*    (2006.01)
*G11C 16/04*    (2006.01)

(52) U.S. Cl.
CPC ........... *G11C 16/28* (2013.01); *G11C 16/0483* (2013.01)

(58) Field of Classification Search
CPC ............................. G11C 16/28; G11C 16/0483
USPC .................................................... 365/185.12
See application file for complete search history.

(56) References Cited

U.S. PATENT DOCUMENTS

| 2012/0284574 A1* | 11/2012 | Avila ............... G11C 16/28 714/704 |
| 2014/0101372 A1* | 4/2014 | Jung ............... G06F 12/0253 711/103 |
| 2014/0368319 A1* | 12/2014 | Kato ............... G06K 7/10366 340/10.4 |

FOREIGN PATENT DOCUMENTS

KR    1020150045747    4/2015

* cited by examiner

*Primary Examiner* — Hoai V Ho
*Assistant Examiner* — Muna A Techane
(74) *Attorney, Agent, or Firm* — IP & T Group LLP

(57) ABSTRACT

A data storage device may include: a nonvolatile memory device including a memory block; and a controller suitable for controlling the nonvolatile memory device to perform a string read operation on the memory block, and estimating a data storage rate of the memory block based on string read data acquired through the string read operation. When performing the string read operation, the nonvolatile memory device may apply the same read voltage to a plurality of word lines included in the memory block at the same time, acquire the string read data from the memory block according to the read voltage, and transmit the string read data to the controller.

20 Claims, 11 Drawing Sheets

DATA STORAGE DEVICE AND OPERATING METHOD THEREOF

CROSS-REFERENCES TO RELATED APPLICATION

The present application claims priority under 35 U.S.C. §119(a) to Korean application number 10-2015-0098489, filed on Jul. 10, 2015, which is incorporated herein by reference in its entirety.

BACKGROUND

1. Technical Field

Various embodiments relate to a data storage device, and more particularly, to a data storage device and an operating method thereof capable of performing a tracing operation for a first erased page.

2. Related Art

A data storage device stores data that is provided from an external device in response to a write request from the external device. The data storage device also provides the external device with stored data in response to a read request from the external device. The external device is an electronic device capable of processing data, and may include a computer, a digital camera, a cellular phone and the like. The data storage device may be embedded in the external device, or may be fabricated separately and then coupled to the external device.

The data storage device may be prepared in the form of a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The data storage device may include a nonvolatile memory apparatus to store data. Nonvolatile memory is able to retain stored data even without a constant source of power. Nonvolatile memory includes flash memory, such as NAND flash or NOR flash, Ferroelectrics Random Access Memory (FeRAM), Phase-Change Random Access Memory (PCRAM), Magnetoresistive Random Access Memory (MRAM), Resistive Random Access Memory (ReRAM), and the like.

SUMMARY

In an embodiment of the present invention, a data storage device may include: a nonvolatile memory device including a memory block; and a controller suitable for controlling the nonvolatile memory device to perform a string read operation on the memory block, and estimating a data storage rate of the memory block based on string read data acquired through the string read operation. When performing the string read operation, the nonvolatile memory device may apply the same read voltage to a plurality of word lines included in the memory block at the same time, acquire the string read data from the memory block according to the read voltage, and transmit the string read data to the controller.

In an embodiment of the present invention, a data storage device may include: a nonvolatile memory device including a memory block; and a controller suitable for controlling the nonvolatile memory device to perform a string read operation on the memory block, selecting a trace region in the memory block based on string read data acquired through the string read operation, and tracing a first erased page in the trace region. When performing the string read operation, the nonvolatile memory device may apply the same read voltage to a plurality of word lines included in the memory block at the same time, acquire the string read data from the memory block according to the read voltage, and transmit the string read data to the controller.

In an embodiment of the present invention, an operating method of a data storage device may include: performing a string read operation by applying the same read voltage to a plurality of word lines included in a memory block at the same time and by acquiring string read data from the memory block according to the read voltage; selecting a trace region in the memory block based on the string read data; and tracing a first erased page in the trace region.

BRIEF DESCRIPTION OF THE DRAWINGS

Features, aspects, and embodiments are described in conjunction with the attached drawings, in which.

DETAILED DESCRIPTION

Figure 1:
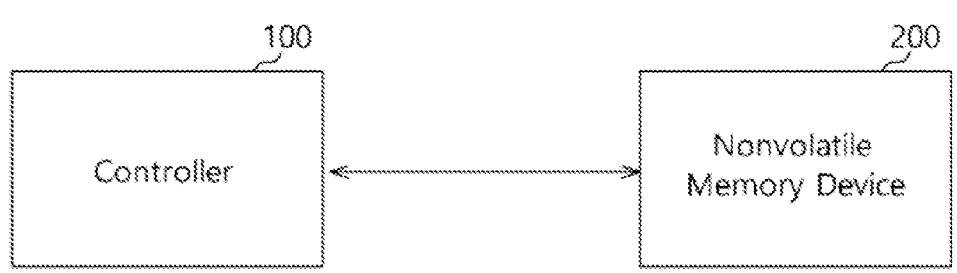
FIG. 1 is a block diagram illustrating a data storage device according to an embodiment of the present invention.

Hereinafter, a data storage device and an operating method thereof according to the present invention will be described with reference to the accompanying drawings through exemplary embodiments. The present invention may, however, be embodied in different forms and should not be construed as limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

FIG. 1 is a block diagram illustrating a data storage device 10 according to an embodiment of the present invention.

The data storage device 10 may include a controller 100 and a nonvolatile memory device 200.

The controller 100 may control overall operations of the data storage device 10. The controller 100 may control a write operation of the nonvolatile memory device 200, in order to store data in the nonvolatile memory device 200 in response to a write request transmitted from an external device. The controller 100 may control a read operation of the nonvolatile memory device 200, in order to read data stored in the nonvolatile memory device 200 and output the read data to the external device in response to a read request transmitted from the external device.

According to the control of the controller 100, the nonvolatile memory device 200 may perform a write operation for storing data and a read operation for reading data. The nonvolatile memory device 200 may include a plurality of memory blocks.

Figure 2A:
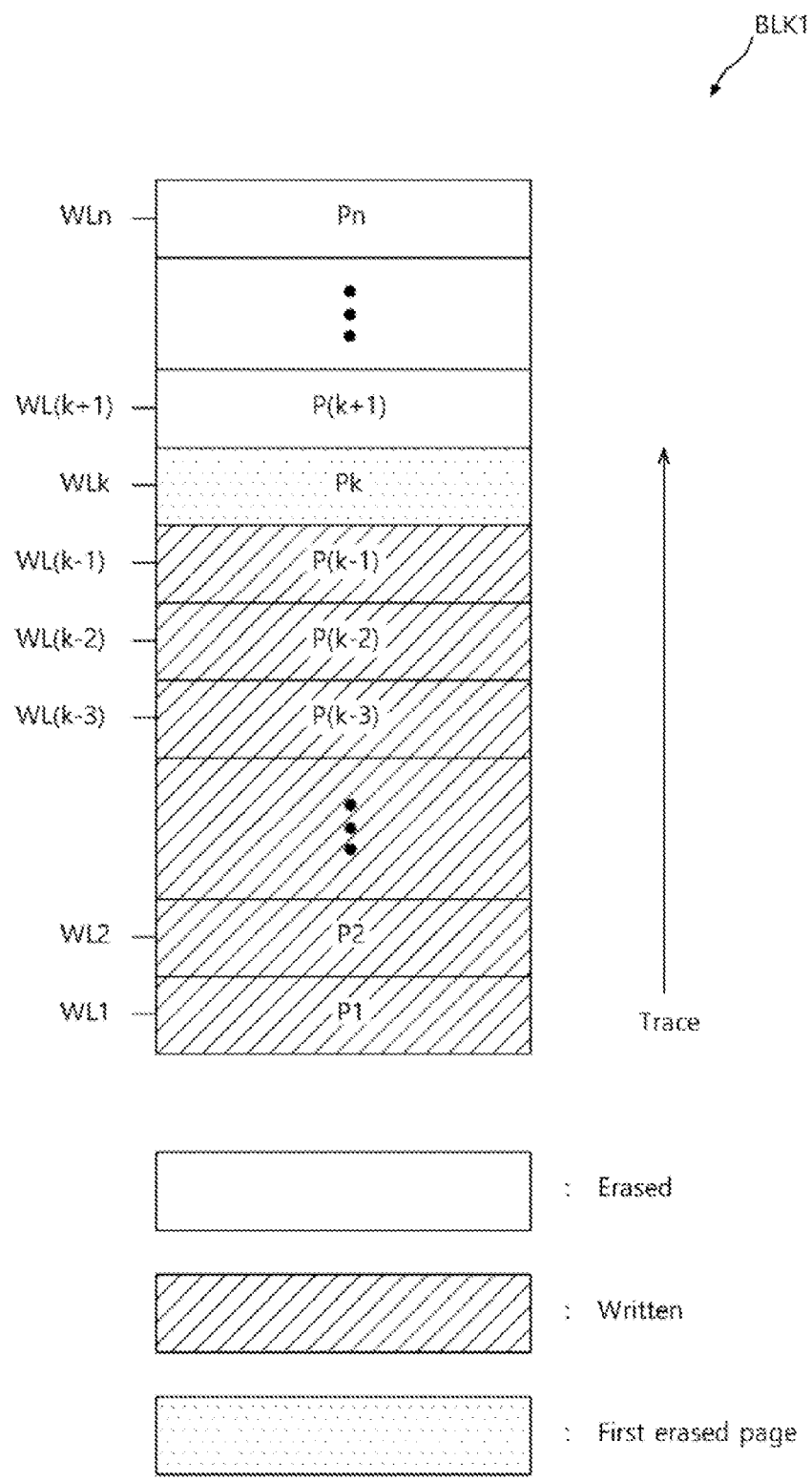
FIGS. 2A and 2B are diagrams illustrating a memory block included in a nonvolatile memory device shown in FIG. 1.
Figure 2B:
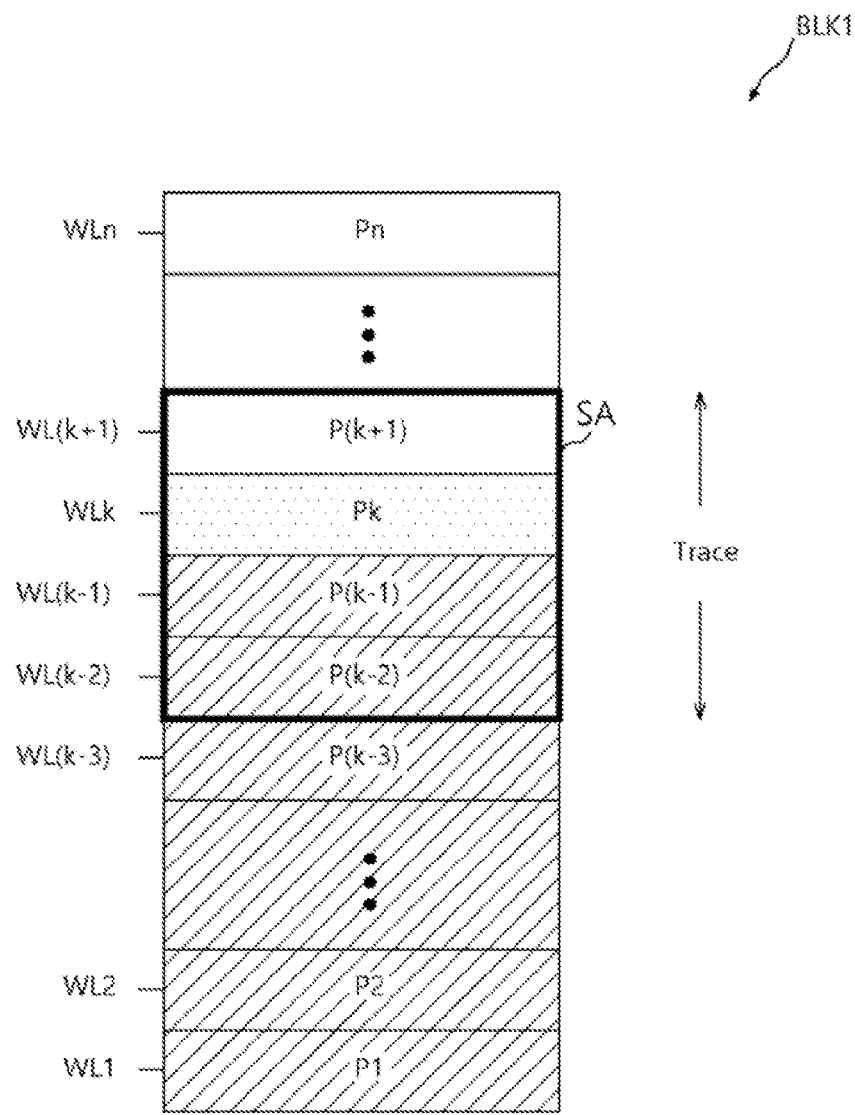

FIGS. 2A and 2B are diagrams illustrating a memory block BLK1 included in the nonvolatile memory device 200. The memory block BLK1 may include a plurality of pages P1 to Pn corresponding to a plurality of word lines WL1 to WLn, respectively.

Although FIGS. 2A and 2B illustrate a single page corresponding to a single word line, the number of pages corresponding to a single word line is not limited to a specific number. The number of pages corresponding to a single word line may vary according to the bit number of data stored in each of memory cells coupled to a single word line.

A single page may be the unit of read or write operations of the nonvolatile memory device 200. The nonvolatile memory device 200 may access a page by driving a word line corresponding to the page, and performing a write operation or read operation on the page. For example, referring to FIG. 2A, the nonvolatile memory device 200 may access a page P1 by driving a word line WL1. The nonvolatile memory device 200 may sequentially perform write operations from the page P1, for example.

Suppose that write operations were completed from page P1 to page P(k-2) and a write operation for page P(k-1) was interrupted by an unexpected power off, that is, a sudden power off in the memory block BLK1. When power is supplied again, the page succeeding the lastly written page P(k-1), that is, a first erased page Pk needs to be traced in order to resume the write operation. The first erased page Pk may be the one to be written immediately after the lastly written page P(k-1) in the memory block BLK1.

Referring to FIG. 2A, the first erased page Pk may be traced by sequentially performing the read operations in the memory block BLK1 from page P1. Specifically, based on data read from the page P1, the nonvolatile memory device 200 may recognize that the page P1 is a written page. Then, based on data read from the pages P2 to P(k-1), the nonvolatile memory device 200 may sequentially recognize that the pages P2 to P(k-1) are written pages. Then, based on data read from the page Pk, that is, erase data, the nonvolatile memory device 200 may recognize that the page Pk is the first erased page.

Referring to FIG. 2B, when the approximate position of the lastly written page P(k-1) in the memory block BLK1 is estimated, a trace region SA may be selected based on the estimated position of the lastly written page P(k-1) and the first erased page Pk may be traced in the selected trace region SA, which is at least one aspect of the exemplary embodiment of the present invention. For example, the first erased page Pk may be traced through the read operation upward starting not from the page P1 but from the page P(k-2) in the selected trace region SA. Alternatively, the first erased page Pk may be traced through the read operation downward starting from the page P(k-2) in the selected trace region SA. Compared to the process illustrated in FIG. 2A, the first erased page Pk can be rapidly traced quickly with low power consumption, because read operations in the trace region SA, which is just a small part of whole pages P1 to Pn, are performed.

Referring back to FIG. 1, the controller 100 may perform the tracing operation for the first erased page on the memory block. Hereafter, the tracing operation will be referred to as the first erased page tracing operation. The first erased page tracing operation may be performed in order to trace the lastly written page in the memory block and trace the first erased page succeeding the lastly written page. When determining that a sudden power off occurred, the controller 100 may perform the first erased page tracing operation for a memory block on which a write operation is ongoing at the sudden power off. With the resume of the power supply, the controller 100 may resume the write operation, which previously stops due to the sudden power off, starting from the first erased page traced through the first erased page tracing operation.

When performing the first erased page tracing operation, the controller 100 may control the nonvolatile memory device 200 to perform a string read operation for a memory block, estimate a trace region in the memory block based on string read data acquired through the string read operation, and trace the first erased page in the trace region. The trace region may be estimated to include the lastly written page in the memory block.

The nonvolatile memory device 200 may perform the string read operation on the memory block under the control of the controller 100. During the string read operation, the nonvolatile memory device 200 may apply the same read voltage to the plurality of word lines included in the memory block at the same time. According to the read voltage, the nonvolatile memory device 200 may transmit the string read data acquired from the memory block to the controller 100.

Based on the string read data transmitted from the nonvolatile memory device 200, the controller 100 may estimate a data storage rate of the memory block, that is, "the number of written pages/the number of entire pages" included in the memory block. For example, in FIG. 2B, the data storage rate may be set to (k-1)/n. The estimation of the data storage rate may indicate the estimation of the position of the lastly written page or the first erased page in the memory block. That is, the controller 100 may estimate the position of the lastly written page, based on the string read data. The controller 100 may select a predetermined region including the lastly written page estimated in the memory block as the trace region. In another embodiment, the controller 100 may estimate the lastly written page in a first region of the memory block according to whether the string read data includes a first value. Then, the controller 100 may select the first region as the trace region according to the estimation result.

The controller 100 may control the nonvolatile memory device 200 to perform one or more read operations on one or more pages included in the selected trace region. The controller 100 may trace the first erased page in the trace region based on one or more read data acquired through the one or more read operations. The process in which the controller 100 traces the first erased page in the trace region may be performed in substantially the same manner as the process described with reference to FIG. 2B. Hereafter, in order to distinguish from the string read operation, a read operation which the nonvolatile memory device 200 performs on a page in the trace region will be referred to as a normal read operation, and read data acquired from the page through the normal read operation will be referred to as normal read data.

In another embodiment, the controller 100 may determine whether a repetition condition is established, and control the string read operation to be repeated using a new read voltage. Whenever the string read operation is repeated the controller 100 may acquire new string read data based on the used read voltage. For example, the controller 100 may determine whether string read data includes the first value. According to the determination result, the controller 100 may control the nonvolatile memory device 200 to repeat the string read operation using a new read voltage. For example, the controller 100 may determine whether an available new read voltage exists in a read voltage list. According to the determination result, the controller 100 may control the nonvolatile memory device 200 to repeat the string read operation using a new read voltage in the read voltage list.

In another embodiment, the controller 100 may control the nonvolatile memory device to perform a read operation using a first read voltage and a second read voltage higher than the first read voltage, estimate whether the lastly written page exists in a first region of the memory block according to whether first string read data based on the first read voltage includes a first value, and estimate whether the lastly written page exists in a second region including the first region of the memory block according to whether second string read data based on the second read voltage includes the first value. When the first string read data includes the first value and the second string read data does not include the first value, the controller 100 may estimate that the lastly written page exists in a part of the second region other than the first region. The controller 100 may select a trace region according to the estimation result.

Figure 3:
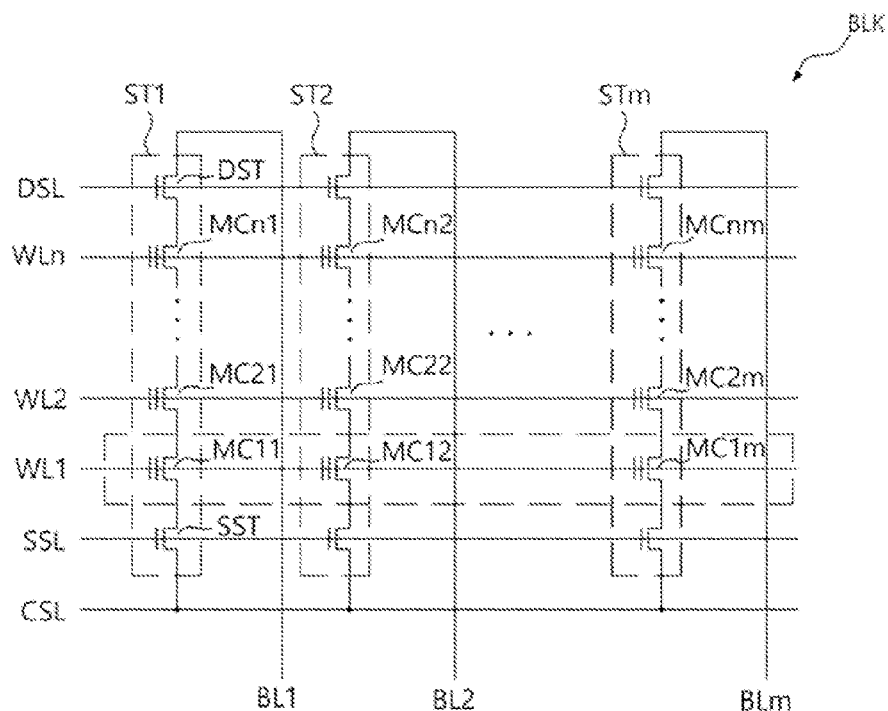
FIG. 3 is a circuit diagram illustrating a memory block included in the nonvolatile memory device shown in FIG. 1.

FIG. 3 is a circuit diagram illustrating a memory block BLK included in the nonvolatile memory device 200.

The memory block BLK may be configured in a two-dimensional array, for example. However, the memory block BLK in accordance with the present embodiment may not be limited to the two-dimensional array, but configured in a three-dimensional array.

The memory block BLK may include strings ST1 to STm. The strings ST1 to STm may be coupled between bit lines BL1 to BLm and a common source line CSL. Each of the strings ST1 to STm may be coupled to the corresponding bit line. Since the strings ST1 to STm are configured in substantially the same manner, the following descriptions will be focused on the configuration of the string ST1 The string ST1 may be coupled between the bit line BL1 and the common source line CSL. The string ST1 may include a drain select transistor DST, a source select transistor SST, and a plurality of memory cells MC1 to MCn1. The drain select transistor DST may include a gate coupled to the drain select line DSL and a drain coupled to the bit line BL1. The source select transistor SST may include a gate coupled to the source select line SSL and a source coupled to the common source line CSL. The plurality of memory cells MC11 to MCn1 may be coupled in series between the drain select transistor DST and the source select transistor SST. Each of the memory cells MC11 to MCn1 may include a gate coupled to the corresponding word line.

Memory cells coupled to a single word line may form a single page. For example, the memory cells MC11 to MC1m coupled to a word line WL1 may correspond to a single page (for example, P1 of FIG. 2A). For example, the page P1 may correspond to the word line WL1.

Figure 4:
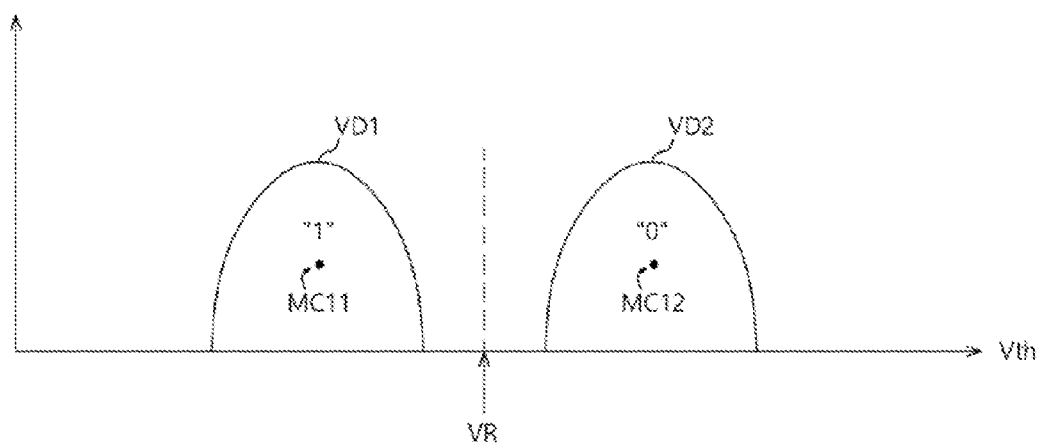
FIG. 4 is threshold voltage distributions illustrating memory cells shown in FIG. 3.

FIG. 4 is threshold voltage distributions VD1 and VD2 illustrating the memory cells MC11 to MCnm shown in FIG. 3.

The memory cells MC11 to MCnm may have constant threshold voltages according to data stored therein, and thus form the threshold voltage distributions VD1 and VD2. For example, the memory cell MC11 in which "1" is stored may form the threshold voltage distribution VD1, and the memory cell. MC12 in which "0" is stored may form the threshold voltage distribution VD2.

During the normal read operation, a read voltage VR determining the threshold voltage of a memory cell may be applied to read data stored in the memory cell. For example, when the read voltage VR1 is applied to a word line coupled to the memory cell, "1" may be read from the memory cell MC11 which is turned on because the memory cell MC11 has a threshold voltage lower than the read voltage VR, and "0" may be read from the memory cell MC12 which is turned off because the memory cell MC12 has a threshold voltage higher than the read voltage VR.

Referring back to FIG. 3, the nonvolatile memory device 200 may perform the normal read operation through the following process. For example, when performing the read operation on the page P1 in the memory block BLK, the nonvolatile memory device 200 may apply a read voltage (for example, VR of FIG. 4) to the word line WL1 corresponding to the page P1, and apply a pass voltage higher than the read voltage VR to the other word lines WL2 to WLn excluding the word line WL1. When the read voltage VR is applied to the word line WL1, the memory cells MC11 to MC1m may be turned on/off according to the threshold voltages thereof, that is, the data stored therein. When the high-level pass voltage is applied to the word lines WL2 to WLn, the memory cells MC21 to MCnm may be turned on. The nonvolatile memory device 200 may sense the voltages of the bit lines BL1 to BLm, which are formed as the memory cells MC11 to MC1m are turned on/off according to the data stored therein and the memory cells MC21 to MCnm are turned on, and determine the data stored in the memory cells MC11 to MC1m.

Figure 5:
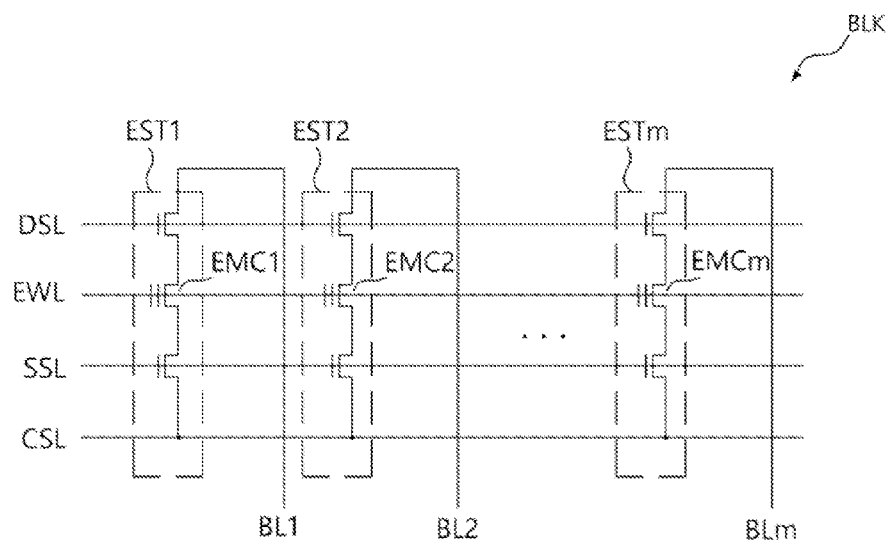
FIG. 5 is an equivalent circuit diagram illustrating a memory block included in the nonvolatile memory device shown in FIG. 1.

FIG. 5 is an equivalent circuit diagram illustrating the memory block BLK included in the nonvolatile memory device 200 shown in FIG. 1. FIG. 5 shows the equivalent circuit of the memory block BLK when the same read voltage is applied at the same time to the word lines WL1 to WLn of the memory block BLK described with reference to FIG. 3.

The memory block BLK may include strings EST1 to ESTm. Each of the strings EST1 to ESTm may be coupled to a corresponding one of the bit lines BL1 to BLm. Since the strings EST1 to ESTm are configured in substantially the same manner, the following descriptions will be focused on the configuration of the string EST1. The string EST1 may be coupled between the bit line BL1 and the common source line CSL. The string EST1 may include a drain select transistor DST, a memory cell EMC1, and a source select transistor SST. The drain select transistor DST and the source select transistor SST may be configured in substantially the same manner as illustrated in FIG. 3. The memory cell EMC1 may be coupled between the drain select transistor DST and the source select transistor SST, and include a gate coupled to a word line EWL.

Referring to FIGS. 3 and 5, when the same read voltage is applied to the word lines WL1 to WLn in the memory block BLK at the same time, the strings ST1 to STm may correspond to the respective strings EST1 to ESTm, memory cells included in a single string may be replaced with a single memory cell, and the memory cell may receive a read voltage through the word line EWL, For example, the string ST1 may equivalently correspond to the string EST1, the memory cells MC11 to MCn1 included in the string ST1 may equivalently correspond to the memory cell EMC1, and the word lines WL1 to WLn may equivalently correspond to the word line EWL.

The threshold voltages of the respective memory cells EMC1 to EMCm may be set according to the threshold voltages of the memory cells included in the corresponding string. For example, when the threshold voltages of the memory cells MC11 to MCn1 included in the string ST1 are high, the memory cell EMC1 may have a high threshold voltage.

Figure 6:
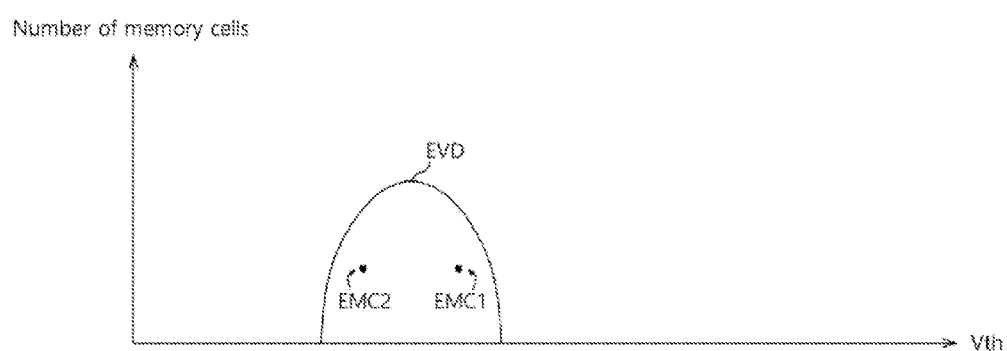
FIG. 6 is a threshold voltage distribution illustrating memory cells included in a memory block shown in FIG. 5.

FIG. 6 is a threshold voltage distribution EVD illustrating the memory cells EMC1 to EMCm included in the memory block BLK shown in FIG. 5.

When data are stored in predetermined pages of the memory block BLK, the memory cells EMC1 to EMCm may form the threshold voltage distribution. EVD within a predetermined range. For example, when the number of memory cells storing "0" among the memory cells MC11 to MCn1 included in the string ST1 is larger than the number of memory cells storing "0" among the memory cells MC12 to MCn2 included in the string ST2, the memory cell EMC1 may have a higher threshold voltage than the memory cell EMC2.

Figure 7:
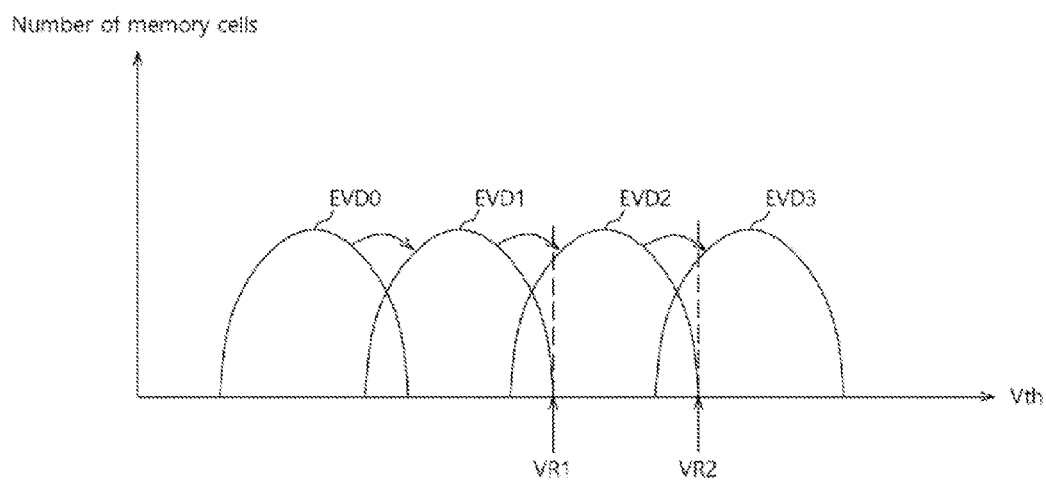
FIG. 7 is a threshold voltage distribution illustrating memory cells according to a data storage rate of a memory block of FIG. 5.

FIG. 7 is a threshold voltage distribution illustrating the memory cells EMC1 to EMCm of the memory block BLK shown in FIG. 5. The data storage rate of the memory block BLK may correspond to "the number of written pages/the number of entire pages" included in the memory block BLK.

As the data storage rate of the memory block BLK increases, the number of written memory cells in a single string increases. Thus, the memory cells EMC1 to EMCm may have a high threshold voltage. Therefore, when the data storage rate of the memory block BLK increases, the threshold voltage distribution. EVD0 of the memory cells EMC1 to EMCm may gradually migrate to the threshold voltage distribution EVD1 to EVD3.

For example, when the data storage rate is 0, that is, when data are not yet written to the memory block BLK, the memory cells EMC1 to EMCm may form the threshold voltage distribution EVD0. When the data storage rate is ⅓, the memory cells EMC1 to EMCm may form a threshold voltage distribution. EVD1. When the data storage rate is ⅔, the memory cells EMC1 to EMCm may form a threshold voltage distribution EVD2. When the data storage rate is 1, that is, when data are written to all pages of the memory block BLK, the memory cells EMC1 to EMCm may form a threshold voltage distribution EVD3.

The data storage rate of the memory block BLK may be estimated through the read voltages VR1 and VR2. The read voltages VR1 and VR2 may be set to threshold voltages corresponding to the right edges of the threshold voltage distributions EVD1 and EVD2. The read voltages VR1 and VR2 may correspond to the data storage ranges of ⅓ and ⅔, respectively.

Suppose that the memory cells EMC1 to EMCm form the threshold voltage distribution EVD1. In this case, the threshold voltages of the memory cells EMC1 to EMCm forming the threshold voltage distribution EVD1 are lower than the read voltage VR1. Thus, when the read voltage VR1 is applied to the word line EL of the memory block BLK, data including only "1" may be outputted. In other words, when the read voltage VR1 is applied to all of the word lines WL1 to WLn of the memory block BLK at the same time, string read data including only "1" may be outputted from the memory block BLK. The string read data may indicate data which are outputted to the bit lines BL1 to BLm at the respective strings ST1 to STm, when a predetermined read voltage is applied to all of the word lines WL1 to WLn of the memory block BLK at the same time.

Suppose that the memory cells EMC1 to EMCm form the threshold voltage distribution EVD2. In this case, the threshold voltages of the memory cells EMC1 to EMCm forming the threshold voltage distribution EVD2 are lower and higher than the read voltage VR1. Thus, when the read voltage VR1 is applied to the word line EWL of the memory block BLK, data including both "1" and "0" may be outputted. In other words, when the read voltage VR1 is applied to all of the word lines WL1 to WLn of the memory block BLK at the same time, string read data including both "1" and "0" may be outputted from the memory block BLK.

Suppose that the memory cells EMC1 to EMCm form the threshold voltage distribution EVD3. In this case, the threshold voltages of the memory cells EMC1 to EMCm forming the threshold voltage distribution EVD3 are higher than the read voltage VR1. Thus, when the read voltage VR1 is applied to the word line EWL of the memory block BLK, data including only "0" may be outputted. In other words, when the read voltage VR1 is applied to all of the word lines WL1 to WLn of the memory block BLK at the same time, string read data including only "0" may be outputted from the memory block BLK.

In short, when a predetermined read voltage is applied to the memory block, string read data outputted from the memory block BLK may differ according to the data storage rate of the memory block BLK. Thus, when the predetermined read voltage is applied to the memory block BLK, the data storage rate of the memory block BLK may be estimated by referring to the string read data. For example, when a read voltage corresponding to a data storage rate of ⅓, for example, the read voltage VR1 is applied to the memory block BLK, the data storage rate of the memory block BLK may be estimated to be lower than ⅓ when the string read data does not include "0". Furthermore, when the read voltage corresponding to a data storage rate of ⅓, for example, the read voltage VR1 is applied to the memory block BLK, the data storage rate of the memory block BLK may be estimated to be higher than ⅓ when the string read data includes one or more "0".

When the data storage rate is referred to as being estimated, it may indicate that the position of the lastly written page or the first erased page in the memory block BLK is estimated. For example, when the data storage rate of the memory block BLK is estimated to be lower than ⅓, the lastly written page may be estimated to exist in a region corresponding to ⅓ of the entire memory block. BLK from the page P1. Furthermore, when the data storage rate of the memory block BLK is estimated to be higher than ⅓, the lastly written page may be estimated to exist in the other region excluding the region corresponding to ⅓ of the entire memory block BLK from the page P1.

According to the above-described logic, the controller 100 may estimate the data storage rate of the memory block BLK and the position of the lastly written page by controlling the string read operation of the nonvolatile memory device 200.

Figure 8:
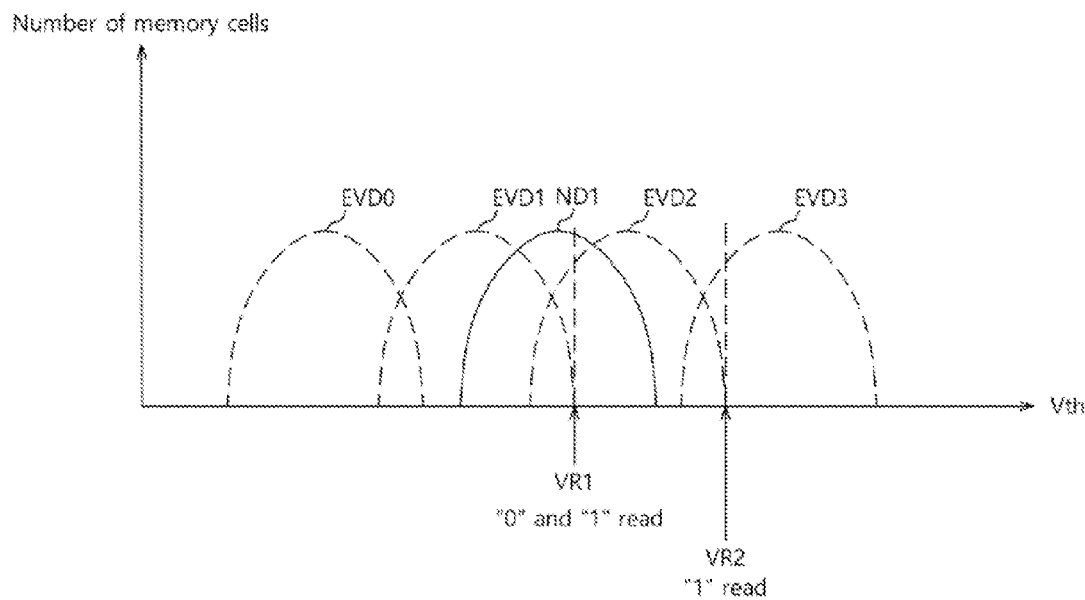
FIG. 8 is a threshold voltage distribution illustrating an example of estimation of a data storage rate of a memory block by a controller shown in FIG. 1.

FIG. 8 is a threshold voltage distribution illustrating an example of estimation of the data storage rate of the memory block BLK by the controller 100 shown in FIG. 1. In FIG. 8, suppose that the data storage rate of the memory block BLK is ½ at the moment. When the data storage rate of the memory block BLK is ½, the memory cells EMC1 to EMCm included in the memory block BLK of FIG. 5 may form a threshold voltage distribution ND1 positioned between the threshold voltage distributions EVD1 and EVD2.

In FIG. 8, the controller 100 may control the nonvolatile memory device 200 to repeat one or more string read operations using the read voltages VR1 and VR2 corresponding to the data storage rates of ⅓ and ⅔, respectively. In the present embodiment, however, the number of read voltages used in the string read operation is not limited to a specific number. As the number of read voltages used for the string read operation increases, the data storage rate of the memory block BLK may be estimated with higher resolution. For example, in order to estimate the data storage rate with a resolution of 1/10, the controller 100 may control the nonvolatile memory device 200 to repeat one or more string read operations using nine read voltages. In this case, the controller 100 can estimate a data storage rate between 3/10 and 4/10, for example. The data storage rates of ⅓ and ⅔ corresponding to the read voltages VR1 and VR2 may be set to reference data storage rates for estimating the data storage rate of the memory block. The reference data storage rate may correspond to the maximum value among data storage rates at which string read data which does not include "0" is outputted when the corresponding read voltage is applied to the word lines WL1 to WLn of the memory block BLK at the same time.

Referring to FIG. 8, the controller 100 may control the nonvolatile memory device 200 to repeat the string read operation using a new read voltage until the string read data does not include "0". The controller 100 may estimate the data storage rate using the string read data acquired whenever the string read operation is performed. First, the controller 100 may control the nonvolatile memory device 200 to perform the string read operation using the read voltage VR1. According to the control of the controller 100, the nonvolatile memory device 200 may apply the read voltage VR1 to all of the word lines WL1 to WLn of the memory block BLK at the same time, and transmit the string read data acquired from the memory block BLK to the controller 100 according to the read voltage VR1. Since the threshold voltages of the memory cells EMC1 to EMCm forming the threshold voltage distribution ND1 are lower or higher than the read voltage VR1, the string read data may include "0" and "1". Based on the string read data, the controller 100 may estimate that the data storage rate of the memory block BLK is higher than ⅓. In other words, the controller 100 may estimate that the lastly written page in the memory block BLK does not exist in the region corresponding to ⅓ of the memory block BLK.

Then, the controller 100 may control the nonvolatile memory device 200 to perform the string read operation using the read voltage VR2. According to the control of the controller 100, the nonvolatile memory device 200 may apply the read voltage VR2 to all of the word lines WL1 to WLn of the memory block BLK at the same time, and transmit the string read data acquired from the memory block BLK to the controller 100 according to the read voltage VR2. Since the threshold voltages of the memory cells EMC1 to EMCm forming the threshold voltage distribution ND1 are lower than the read voltage VR2, the string read data may include only "1". That is, the string read data may not include "0". Based on the string read data, the controller 100 may estimate that the data storage rate of the memory block BLK is lower than ⅔. In other words, the controller 100 may estimate that the lastly written page in the memory block BLK exists in the region corresponding to ⅔ of the memory block BLK.

Thus, based on the string read data by the read voltage VR1 and the string read data by the read voltage VR2, the controller 100 may estimate that the data storage rate of the memory block BLK is higher than ⅓ and lower than ⅔. In other words, the controller 100 may estimate that the lastly written page in the memory block BLK exists in a part of the region corresponding to ⅔ of the memory block BLK other than the region corresponding to ⅓ of the memory block BLK.

Figure 9:
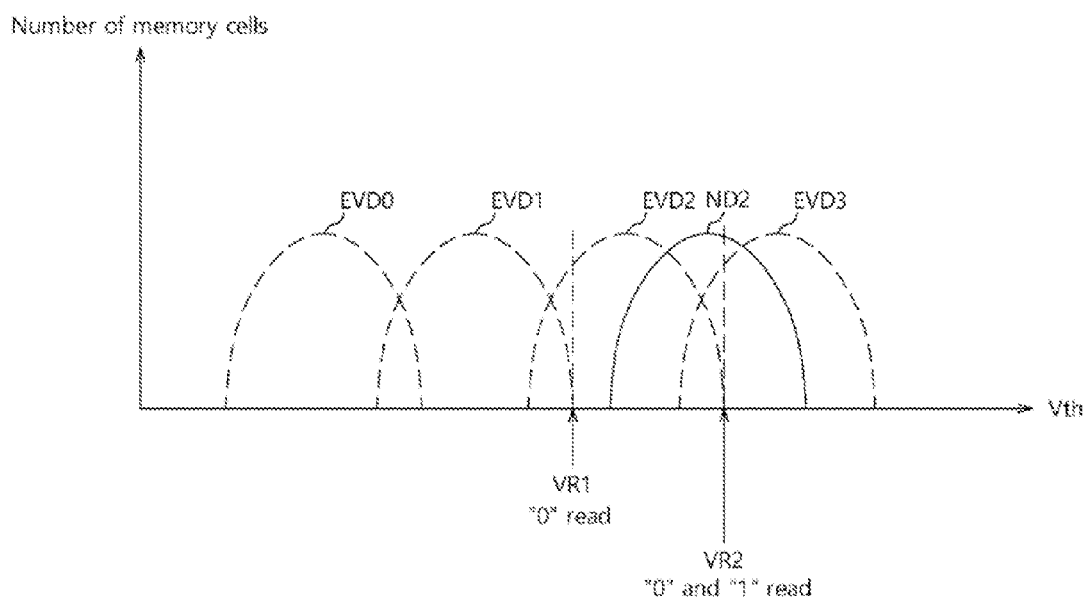
FIG. 9 is a threshold voltage distribution illustrating another example of estimation of a data storage rate of a memory block by a controller shown in FIG. 1.

FIG. 9 is a threshold voltage distribution illustrating another example of estimation of the data storage rate of the memory block BLK by the controller 100 shown in FIG. 1. In FIG. 9, suppose that the data storage rate of the memory block BLK is ¾ at the moment. When the data storage rate of the memory block BLK is ¾, the memory cells EMC1 to EMCm included in the memory block BLK may form a threshold voltage distribution ND2 positioned between the threshold voltage distributions EVD2 and EVD3. In FIG. 9, the controller 100 may control the nonvolatile memory device 200 to perform one or more string read operations using the read voltages VR1 and VR2 corresponding to the data storage rates of ⅓ and ⅔, respectively.

Referring to FIG. 9, the controller 100 may control the nonvolatile memory device 200 to repeat the string read operation using a new read voltage in the read voltage list until all of read voltages included in the read voltage list are used for a plurality of string read operations.

First, the controller 100 may control the nonvolatile memory device 200 to perform the string read operation using the read voltage VR1. According to the control of the controller 100, the nonvolatile memory device 200 may apply the read voltage VR1 to all of the word lines WL1 to WLn of the memory block BLK at the same time, and transmit string read data acquired from the memory block BLK to the controller 100 according to the read voltage VR1. Since the threshold voltages of the memory cells EMC1 to EMCm forming the threshold voltage distribution ND2 are higher than the read voltage VR1, the string read data may include only "0". Based on the string read data, the controller 100 may estimate that the data storage rate of the memory block BLK is higher than ⅓. In other words, the controller 100 may estimate that the lastly written page in the memory block BLK does not exist in the region corresponding to ⅓ of the memory block BLK.

Furthermore, the controller 100 may control the nonvolatile memory device 200 to perform the string read operation using the read voltage VR2. According to the control of the controller 100, the nonvolatile memory device 200 may apply the read voltage VR2 to all of the word lines WL1 to WLn of the memory block BLK at the same time, and transmit string read data acquired from the memory block BLK to the controller 100 according to the read voltage VR2. Since the threshold voltages of the memory cells EMC1 to EMCm forming the threshold voltage distribution ND2 are lower or higher than the read voltage VR2, the string read data may include "1" or "0". Based on the string read data, the controller 100 may estimate that the data storage rate of the memory block BLK is higher than ⅔. In other words, the controller 100 may estimate that the lastly written page in the memory block BLK does not exist in the region corresponding to ⅔ of the memory block BLK.

The controller 100 may determine that both of the read voltages VR1 and VR2 included in the read voltage list are used for the string read operations, and estimate the data storage rate without controlling the nonvolatile memory device 200 to further perform the string read operation. The controller 100 may estimate that the data storage rate of the memory block BLK is higher than ⅔.

Figure 10:
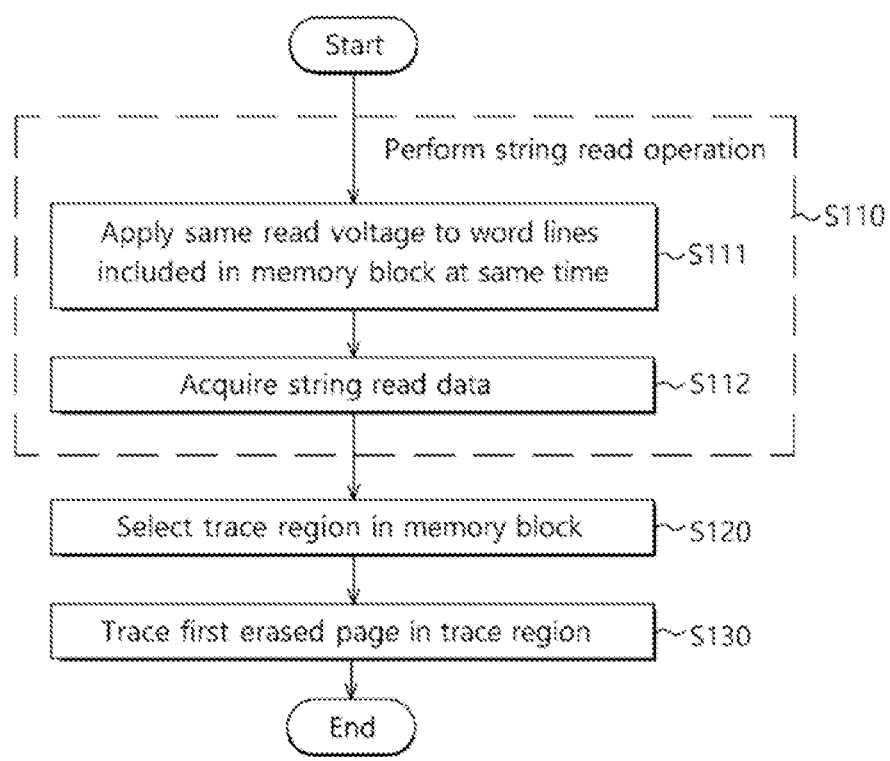
FIG. 10 is a flowchart illustrating an operation method of a controller according to an embodiment of the present invention.

FIG. 10 is a flowchart illustrating an operation method of the controller 100 according to an embodiment of the present invention.

At step S110, the nonvolatile memory device 200 may perform a string read operation on a memory block under the control of the controller 100. More specifically, at step S111, the nonvolatile memory device 200 may apply the same read voltage to a plurality of word lines included in the memory block at the same time. At step S112, the nonvolatile memory device 200 may acquire string read data from the memory block according to the read voltage. The string read data may be read according to the data storage rate of the memory block.

At step S120 the controller 100 may select a trace region in the memory block based on the string read data. When the string read data does not include a first value, for example, "0", the controller 100 may estimate that the data storage rate of the memory block is lower than a reference data storage rate corresponding to the read voltage. When the string read data includes "0", the controller 100 may estimate that the data storage rate of the memory block is higher than the reference data storage rate corresponding to the read voltage. The reference data storage rate may correspond to the maximum value among data storage rates at which string read data which does not include "0" is outputted, when the corresponding read voltage is applied to the word lines of the memory block at the same time. The controller 100 may select the trace region according to the estimated data storage rate.

At step S130, the controller 100 may trace the first erased page in the trace region. The controller 100 may control one or more normal read operations for one or more pages included in the trace region, and estimate the first erased page based on normal read data acquired through the one or more read operations.

Figure 11:
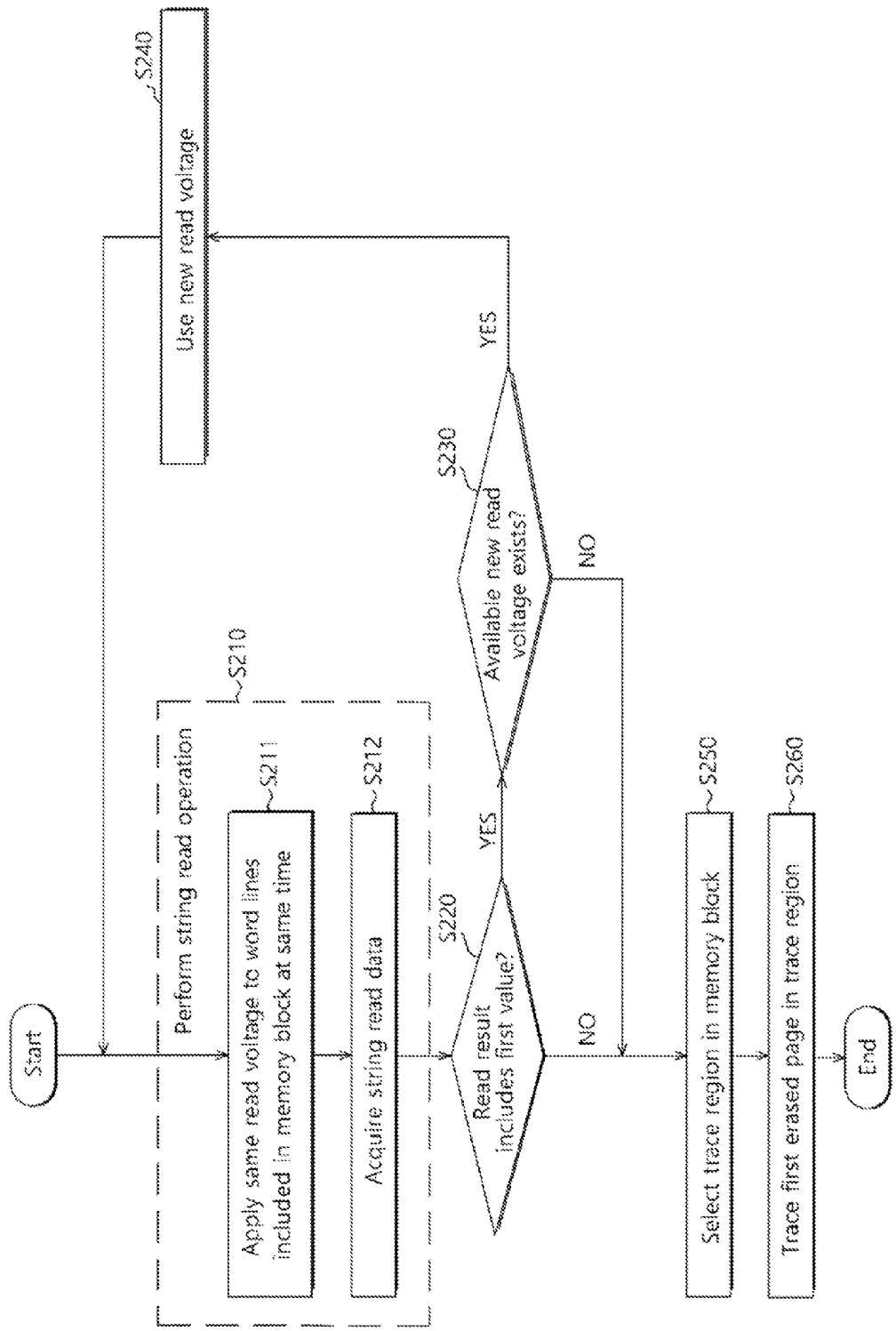
FIG. 11 is a flowchart illustrating an operation method of a controller according to an embodiment of the present invention.

FIG. 11 is a flowchart illustrating an operation method of the controller 100 according to an embodiment of the present invention. Referring to FIG. 11, the data storage device 10 may repeat a string read operation using a new read voltage according to whether a repetition condition is established. The data storage device 10 may estimate a data storage rate with more precision, based on string read data which are acquired whenever the string read operation is repeated.

At step S210, the nonvolatile memory device 200 may perform a string read operation on a memory block under the control of the controller 100. Specifically, at step S211, the nonvolatile memory device 200 may apply the same read voltage to a plurality of word lines included in the memory block at the same time. At step S212, the nonvolatile memory device 200 may acquire string read data from the memory block according to the read voltage. The string read data may be read according to the data storage rate of the memory block.

At step S220 the controller 100 may determine whether the string read data includes a first value, for example, "0". When it is determined that the string read data includes "0" (Yes), the procedure may proceed to step S230. When it is determined that the string read data does not include "0" (No), the procedure may proceed to step S250.

At step S230, the controller 100 may determine whether an available new read voltage exists in the read voltage list. The read voltage list may include a plurality of read voltages which can be used during the string read operation. When it is determined that an available new read voltage exists in the read voltage list (Yes), the procedure may proceed to step S240. When it is determined that an available new read voltage does not exist in the read voltage list (No), the procedure may proceed to step S250.

At step S240, the controller 100 may control the nonvolatile memory device 200 to use a new read voltage in the read voltage list and repeat steps S210 to 240.

That is, the nonvolatile memory device 200 may repeat the string read operation using new read voltages, until the string read data does not include "0" or until no available read voltages exist in the read voltage list. The controller 100 may acquire new string read data whenever the string read operation is repeated according to a new read voltage.

At step S250, the controller 100 may select a trace region in the memory block based on the string read data. When first string read data by a first read voltage includes "0" and second string read data by a second read voltage does not include "0", the controller 100 may estimate that the data storage rate of the memory block is between a first reference data storage rate corresponding to the first read voltage and a second reference data storage rate corresponding to the second read voltage.

Step S260 may be performed in substantially the same manner as step S130 of FIG. 10.

Figure 12:
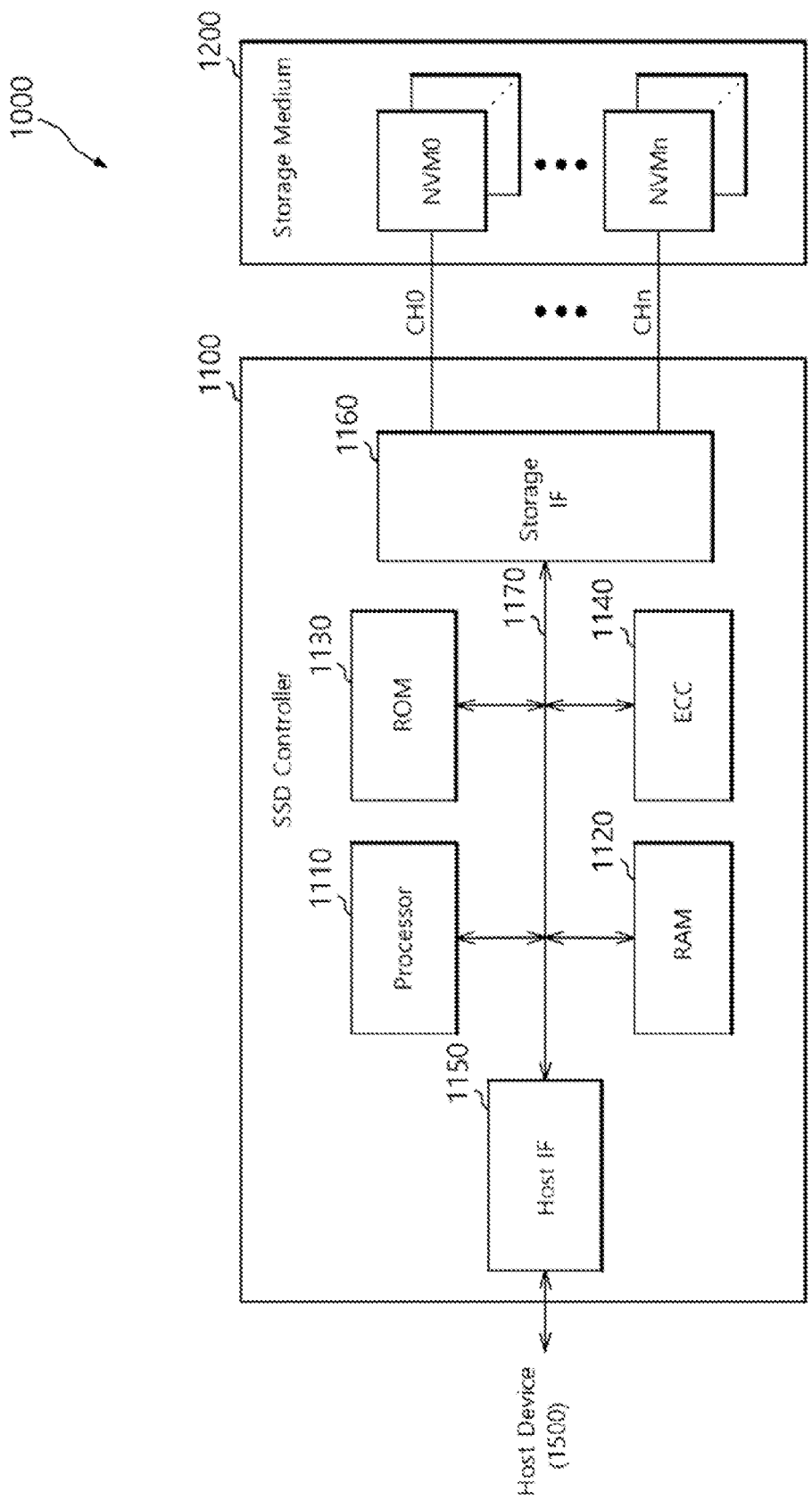
FIG. 12 is a block diagram illustrating an SSD in accordance with an embodiment of the present invention.

FIG. 12 is a block diagram illustrating an SSD (Solid State Drive) 1000 in accordance with an embodiment of the present invention.

The SSD 1000 may include an SSD controller 1100 and a storage medium 1200.

The SSD controller 1100 may control data exchange between a host device 1500 and the storage medium 1200. The SSD controller 1100 may include a processor 1110, a RAM 1120, a ROM 1130, an ECC unit 1140, a host interface unit 1150, and a storage interface unit 1160.

The SSD controller 1100 may operate in substantially the same manner as the controller 100 illustrated in FIG. 1. The SSD controller 1100 may estimate the data storage rate of a memory block included in the storage medium 1200. The SSD controller 1100 may rapidly trace the first erased page in the memory block.

The processor 1110 may control overall operations of the SSD controller 1100. The processor 1110 may store data in the storage medium 1200 according to a request of the host device 1500, and read the stored data from the storage medium 1200. The processor 1110 may control an internal operation of the SSD 1000, such as a merge operation or wear leveling operation, in order to efficiently manage the storage medium 1200.

The RAM 1120 may store a program and program data which are used by the processor 1110. The RAM 1120 may temporarily store data transmitted from the host interface unit 1150, before the data are transmitted to the storage medium 1200. Furthermore, the RAM 1120 may temporarily store data transmitted from the storage medium 1200, before the data are transmitted to the host device 1500.

The ROM 1130 may store a program code read by the processor 1110. The program code may include commands which are processed by the processor 1110, in order to control the internal units of the SSD controller 1100.

The ECC unit 1140 may encode data to be stored in the storage medium 1200, and decode data read from the storage medium 1200. The ECC unit 1140 may detect and correct an error which occurred in data, according to the ECC algorithm.

The host interface unit 1150 may exchange requests and data with the host device 1500.

The storage interface unit 1160 may transmit control signals and data to the storage medium 1200. The storage interface unit 1160 may receive data from the storage medium 1200. The storage interface unit 1160 may be coupled to the storage medium 1200 through a plurality of channels CH0 to CHn.

The storage medium 1200 may include a plurality of nonvolatile memory devices NVM0 to NVMn. Each of the nonvolatile memory devices NVM0 to NVMn may perform a write operation and a read operation according to control of the SSD controller 1100. Each of the nonvolatile memory devices NVM0 to NVMn may be configured and operated in substantially the same manner as the nonvolatile memory device 200 illustrated in FIG. 1.

Figure 13:
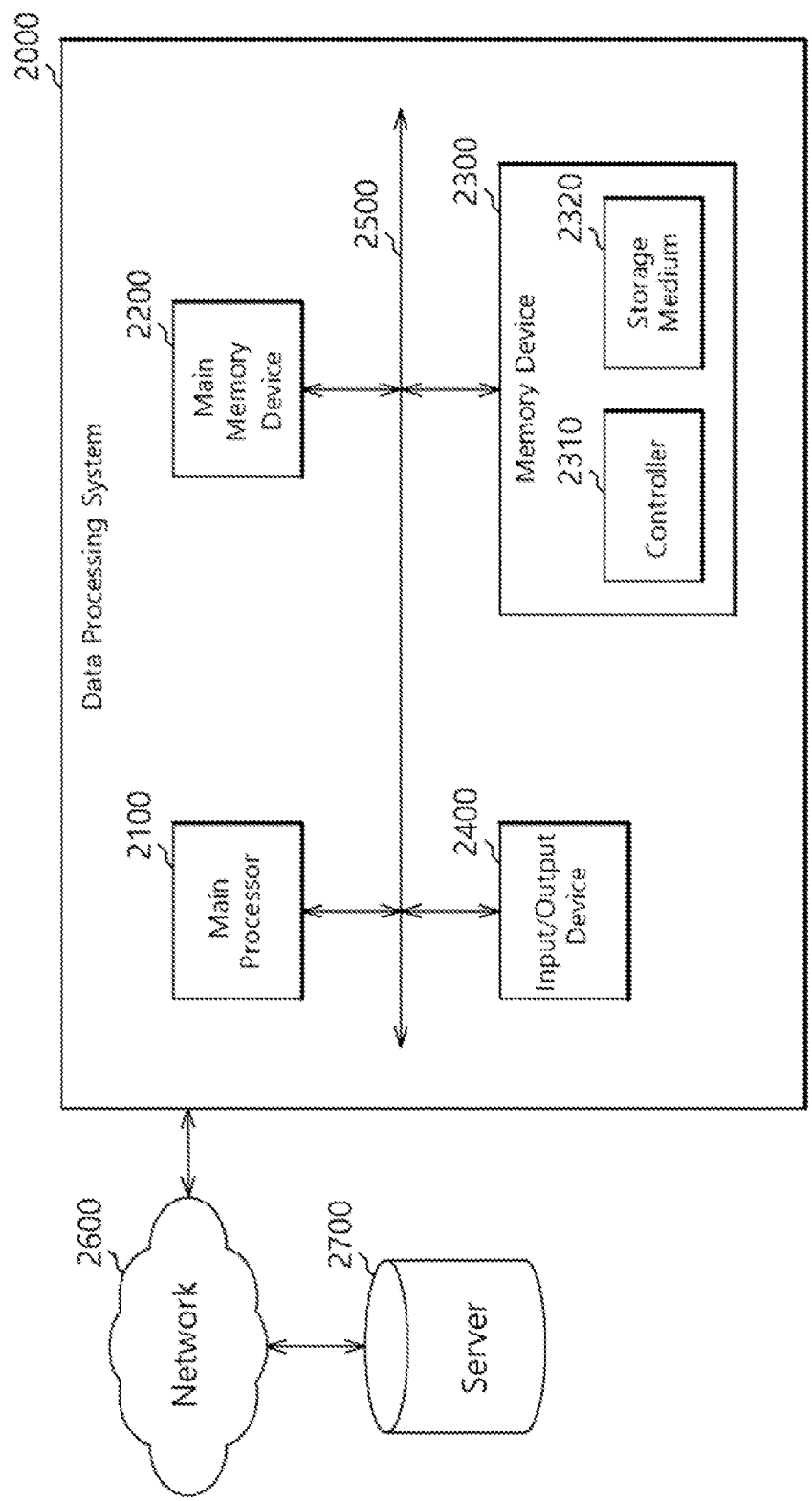
FIG. 13 is a block diagram illustrating a data processing system to which the data storage device in accordance with the embodiment of the present invention is applied.

FIG. 13 is a block diagram illustrating a data processing system 2000 to which the data storage device 10 in accordance with the embodiment of the present invention is applied.

The data processing system 2000 may include a computer, a laptop computer, a net-book computer, a smart phone, a digital TV, a digital camera, a navigation system and the like. The data processing system 2000 may include a main processor 2100, a main memory device 2200, a memory device 2300, and an input/output device 2400. The internal units of the data processing system 2000 may exchange data and control signals through a system bus 2500.

The main processor 2100 may control overall operations of the data processing system 2000. The main processor 2100 may include a central processing unit (CPU) such as a microprocessor. The main processor 2100 may execute software for an operating system, an application, or a device driver on the main memory device 2200.

The main memory device 2200 may store a program and program data which are used by the main processor 2100. The main memory device 2200 may temporarily store data to be transmitted to the memory device 2300 and the input/output device 2400.

The memory device 2300 may include a memory controller 2310 and a storage medium 2320. The memory device 2300 may be configured and operated in substantially the same manner as the data storage device 10 of FIG. 1.

The input/output device 2400 may include a keyboard, a scanner, a touch screen, and a mouse, which can exchange information with a user. For example, the input/output device 2400 may receive a command for controlling the data processing system 2000 from the user or provide a processing result to the user.

In another embodiment, the data processing system 2000 may communicate with one or more servers 2700 through a network 2600 such as LAN (Local Area Network), WAN (Wide Area Network), or a wireless network. The data processing system 2000 may include a network interface unit (not illustrated) for connecting to the network 2600.

While certain embodiments have been described above, it will be understood to those skilled in the art that the embodiments described are examples only. Accordingly, the data storage device described herein should not be limited based on the described embodiments. Rather, the data storage device described herein should only be limited in light of the claims that follow when taken in conjunction with the above description and accompanying drawings.

What is claimed is:

1. A data storage device comprising:
a nonvolatile memory device comprising a memory block; and
a controller suitable for controlling the nonvolatile memory device to perform a string read operation on the memory block, and estimating a data storage rate of the memory block based on string read data acquired through the string read operation,
wherein when performing the string read operation, the nonvolatile memory device acquires the string read data from the memory block by applying a read voltage to a plurality of word lines included in the memory block at the same time, and transmits the string read data to the controller, and
wherein the data storage rate is a rate of a number of written pages in the memory block to a number of entire pages in the memory block.

2. The data storage device according to claim 1, wherein the controller determines whether the string read data includes a first value, and controls the nonvolatile memory device to repeat the string read operation using a new read voltage according to the determination result.

3. The data storage device according to claim 1, wherein the controller estimates whether the data storage rate is higher than a reference data storage rate corresponding to the read voltage according to whether the string read data includes a first value.

4. The data storage device according to claim 3, wherein the reference data storage rate comprises the maximum value among data storage rates at which string read data which does not include the first value is outputted when the read voltage is applied to the plurality of word lines at the same time.

5. The data storage device according to claim 1,
wherein the controller controls the nonvolatile memory device to perform the string read operation using a first read voltage and a second read voltage higher than the first read voltage,
wherein the controller estimates whether the data storage rate is higher than a first reference data storage rate corresponding to the first read voltage according to whether first string read data based on the first read voltage includes a first value, and
wherein the controller estimates whether the data storage rate is higher than the first reference data storage rate and higher than a second reference data storage rate corresponding to the second read voltage according to whether second string read data based on the second read voltage includes the first value.

6. The data storage device according to claim 5, wherein the controller estimates that the data storage rate is higher than the first reference data storage rate and lower than the second reference data storage rate when the first string read data includes the first value and the second string read data does not includes the first value.

7. A data storage device comprising:
a nonvolatile memory device comprising a memory block; and a controller suitable for controlling the nonvolatile memory device to perform a string read operation on the memory block, selecting a portion of the memory block as a trace region based on string read data acquired through the string read operation, and tracing a first erased page in the trace region, wherein when performing the string read operation, the nonvolatile memory device acquires the string read data from the memory block by applying a read voltage to a plurality of word lines included in the memory block at the same time, and transmits the string read data to the controller, and wherein the first erased page is a page succeeding a lastly written page in the memory block.

8. The data storage device according to claim 7, wherein the controller determines whether the string read data includes a first value, and controls the nonvolatile memory device to repeat the string read operation using a new read voltage according to the determination result.

9. The data storage device according to claim 7, wherein the controller determines whether an available new read voltage exists in a read voltage list, and controls the nonvolatile memory device to repeat the string read operation using the new read voltage according to the determination result.

10. The data storage device according to claim 7, wherein the controller estimates whether the lastly written page exists in a first region of the memory block according to whether the string read data includes a first value, and selects the trace region according to the estimation result.

11. The data storage device according to claim 7, wherein the controller controls the nonvolatile memory device to perform the string read operation using a first read voltage and a second read voltage higher than the first read voltage, wherein the controller estimates whether the lastly written page exists in a first region of the memory block according to whether first string read data based on the first read voltage includes a first value, wherein the controller estimates whether the lastly written page exists in a second region including the first region of the memory block according to whether second string read data based on the second read voltage includes the first value, and wherein the controller selects the trace region according to the estimation result.

12. The data storage device according to claim 11, wherein the controller estimates that the lastly written page exists in a part of the second region excluding the first region when the first string read data includes the first value and the second string read data does not include the first value.

13. The data storage device according to claim 7, wherein the controller controls one or more normal read operations for one or more pages included in the trace region, and traces the first erased page based on normal read data acquired through the one or more normal read operations.

14. An operating method of a data storage device, comprising:

performing a string read operation by applying a read voltage to a plurality of word lines included in a memory block at the same time and by acquiring string read data from the memory block according to the read voltage;

selecting a portion of the memory block as a trace region based on the string read data; and tracing a first erased page in the trace region, wherein the first erased page is a page succeeding a lastly written page in the memory block.

15. The operating method according to claim 14, further comprising determining whether the string read data includes a first value, wherein the performing of the string read operation repeats the string read operation using a new read voltage according to the determination result, and wherein the selecting of the trace region selects the trace region on the basis of string read data acquired through the repeated string read operations.

16. The operating method according to claim 14, further comprising determining whether an available new read voltage exists in a read voltage list, wherein performing of the string read operation repeats the string read operation using the new read voltage according to the determination result, and wherein the selecting of the trace region selects the trace region on the basis of string read data acquired through the repeated string read operations.

17. The operating method according to claim 14, wherein the selecting of the trace region comprises:

estimating whether the lastly written page exists in a first region of the memory block according to whether the string read data includes a first value; and selecting the trace region according to the estimation result.

18. The operating method according to claim 14, wherein the performing of the string read operation comprises:

acquiring first string read data from the memory block according to a first read voltage; and acquiring second string read data from the memory block according to a second read voltage higher than the first read voltage, and wherein the selecting of the trace region comprises:

estimating whether the lastly written page exists in a first region of the memory block according to whether the first string read data includes a first value;

estimating whether the lastly written page exists in a second region including the first region of the memory block according to whether the second string read data includes the first value; and selecting the trace region according to the estimation result.

19. The operating method according to claim 18, wherein the lastly written page is estimated to exist in a part of the second region other than the first region when the first string read data includes the first value and the second string read data does not include the first value.

20. The operating method according to claim 14, wherein the tracing of the first erased page comprises:

controlling one or more normal read operations for one or more pages included in the trace region; and tracing the first erased page based on normal read data acquired through the one or more normal read operations.

* * * * *